United States Patent
Gedamu et al.

(10) Patent No.: US 6,969,952 B2
(45) Date of Patent: Nov. 29, 2005

(54) SYSTEM AND METHOD FOR AUTOMATICALLY ROUTING POWER FOR AN INTEGRATED CIRCUIT

(75) Inventors: Eilas Gedamu, Calgary (CA); Denise Man, Fort Collins, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 112 days.

(21) Appl. No.: 10/633,000

(22) Filed: Aug. 1, 2003

(65) Prior Publication Data

US 2005/0028124 A1 Feb. 3, 2005

(51) Int. Cl.[7] .......................... G06F 17/50; H01L 27/10
(52) U.S. Cl. .......................... 315/94; 716/12; 257/206
(58) Field of Search ................ 315/94, 39.51; 716/12–15, 9–10; 257/203–204, 206–207, 378, 69, 365, 393

(56) References Cited

U.S. PATENT DOCUMENTS

| | | | |
|---|---|---|---|
| 4,569,743 A | 2/1986 | Bayer et al. | |
| H0512 H * | 8/1988 | Borgini et al. | 257/369 |
| 5,040,144 A | 8/1991 | Pelley et al. | |
| 5,075,753 A * | 12/1991 | Kozono | 257/207 |
| 5,150,019 A | 9/1992 | Thomas et al. | |
| 5,168,342 A * | 12/1992 | Shibata | 257/210 |
| 5,404,312 A * | 4/1995 | Tawada | 716/12 |
| 5,572,042 A | 11/1996 | Thomas et al. | |
| 5,713,774 A | 2/1998 | Thomas et al. | |
| 5,956,618 A | 9/1999 | Liu et al. | |
| 6,253,364 B1 * | 6/2001 | Tanaka et al. | 716/13 |
| 6,326,258 B1 | 12/2001 | Iizuka | |
| 6,346,471 B1 | 2/2002 | Okushima et al. | |
| 6,362,339 B1 | 3/2002 | McCormick | |
| 6,429,105 B1 | 8/2002 | Kumikiyo | |
| 6,440,822 B1 | 8/2002 | Hayama et al. | |
| 6,465,376 B2 | 10/2002 | Uzoh et al. | |
| 6,514,885 B1 | 2/2003 | Onga et al. | |
| 6,541,873 B1 | 4/2003 | Bobba et al. | |
| 6,577,002 B1 | 6/2003 | Bobba et al. | |
| 6,581,201 B2 | 6/2003 | Cano et al. | |
| 6,759,698 B2 * | 7/2004 | Tanaka | 257/206 |
| 2003/0221175 A1 * | 11/2003 | Tanaka | 716/6 |
| 2004/0031010 A1 * | 2/2004 | Kaida | 716/12 |

* cited by examiner

*Primary Examiner*—Thuy V. Tran
*Assistant Examiner*—Chuc Tran

(57) ABSTRACT

A system for automatically routing power in an integrated circuit, the system comprising memory for storing data defining a representation of an integrated circuit having a power contact and a power connection, and logic configured to analyze the data and to automatically route power from the power connection to the power contact.

20 Claims, 11 Drawing Sheets

SYSTEM AND METHOD FOR AUTOMATICALLY ROUTING POWER FOR AN INTEGRATED CIRCUIT

BACKGROUND

An integrated circuit (IC), e.g., a microprocessor chip, generally comprises a transistor layer and a plurality of interconnect layers. The interconnect layers are typically metal, e.g., aluminum, and the interconnect layers are usually separated by some type of dielectric material, e.g., silicon dioxide ($SiO_2$), for insulation between the metal interconnect layers. The transistor layer typically comprises a plurality of logical cells, and such metal interconnect layers are used not only to route signals from one logical cell to another, but the metal interconnect layers are also used to route power from a power connection that is exposed to a power source to components within the integrated circuit.

Typically, the metal interconnect layers comprise alternating and variable power and ground buses, referred to in the art as a "power grid." The power grid typically encompasses, on each interconnect level, a series of alternating buses, e.g., alternating between power and ground, and the buses are often directionally oriented in alternating fashion per metal interconnect level. For example, an IC may comprise eight metal interconnect layers (M1–M8) wherein the top metal layer M8 comprises alternating power and ground buses oriented horizontally relative to the power and ground buses of metal layer M7, which may be oriented vertically, thereby forming power and ground buses orthogonal to adjacent metal interconnect layers. Connections, sometimes referred to as "vias," are made from one metal layer to another in order to connect logic cells formed on the transistor layer and to provide power and ground from the top metal interconnect layer M8 to the transistor layer. Such via connections are said in the art to provide contact between the various metal interconnect layers.

An IC design engineer typically uses a design tool that allows the engineer to visually create a graphical representation of circuit diagrams that effectuate a particular functionality related to an IC. The automated tool then transforms the graphical representation into related data that describes the layout of the circuit. Frequently, each design engineer in a team of design engineers is assigned a design "block" which the design engineer is responsible for creating. A block refers to a three-dimensional portion of the IC that is designed to perform a particular function. The block usually includes a plurality of logic cells, which are typically interconnected to perform a desired function assigned to the engineer. The interconnections between the logic cells are typically made using the lower metal layers, and such interconnections are commonly referred to as "signal routes."

In addition to routing signals between the plurality of logical cells, the metal interconnect layers are also used to distribute power from an external source to the logical cells. The top layer M8 often receives power (VDD) and ground (GND), then distributes the power through vias to the logical cells that are in need of power and ground. Typically, in the IC design process, the step of routing power to the blocks of an IC is performed manually.

SUMMARY OF THE DISCLOSURE

Generally, embodiments of the present disclosure provide systems and methods for automatically routing power and ground of integrated circuit design.

A system in accordance with an exemplary embodiment of the present disclosure comprises memory for storing data defining a representation of an integrated circuit having a power contact and a power connection, and logic configured to analyze the data and to automatically route power from the power connection to the power contact.

Further, a method in accordance with an exemplary embodiment of the present disclosure comprises the steps of storing data defining a representation of an integrated circuit having a power contact and a power connection; analyzing the data to determine the location of the power connection and the power contact; automatically routing power from the power connection to the power contact; and creating a representation of the power routing.

BRIEF DESCRIPTION OF THE DRAWINGS

The disclosure can be better understood with reference to the following drawings.

DETAILED DESCRIPTION OF THE DISCLOSURE

Embodiments of the present disclosure generally pertain to systems and methods for automatically designing power routing to an IC. Specifically, a routing system in accordance with one embodiment of the present disclosure parses particular textual data from a dataset that is indicative of characteristics related to a design block of an IC.

Figure 1:
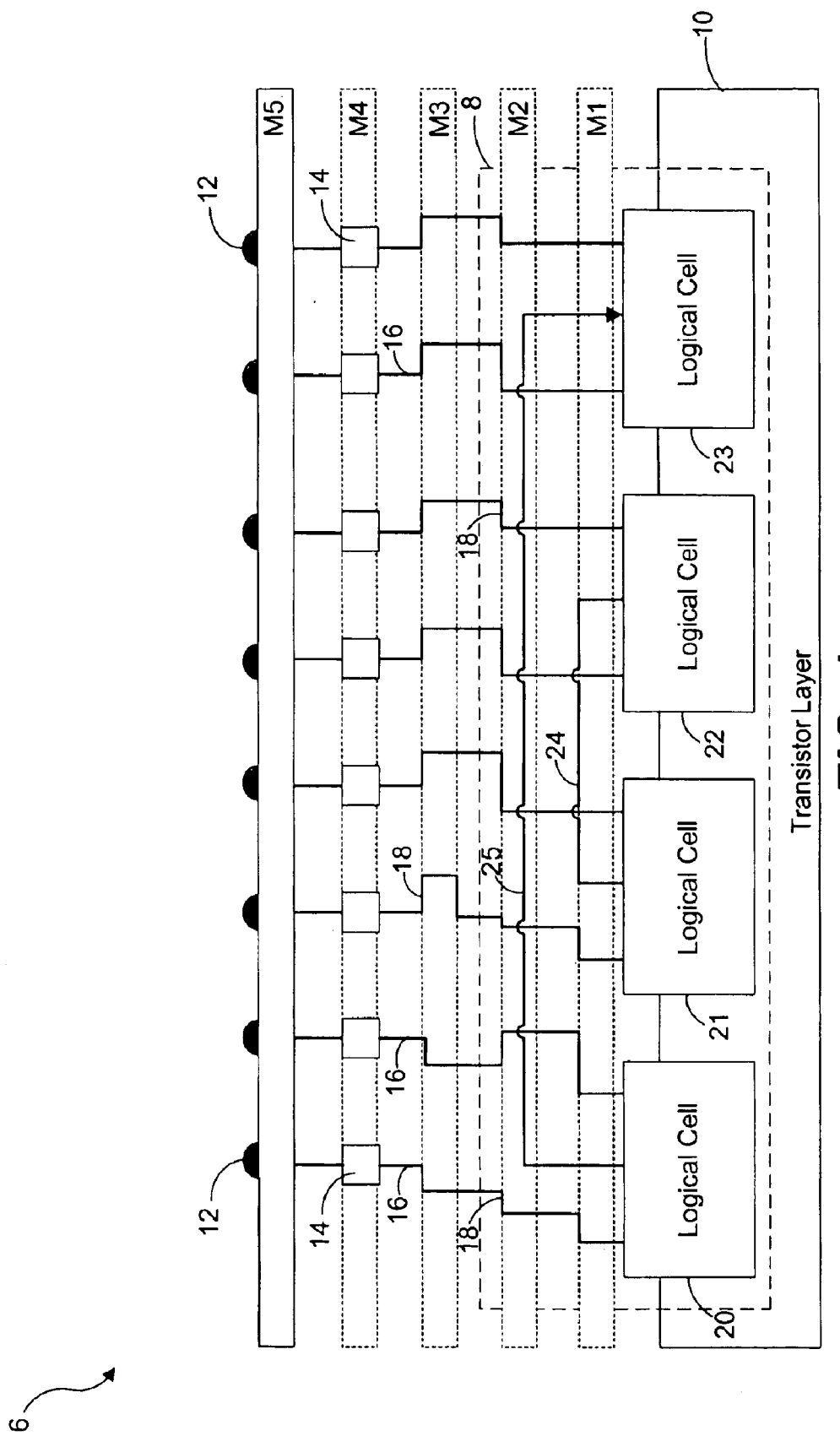
FIG. 1 is a block diagram illustrating a side view of an integrated circuit (IC).

In this regard, with reference to a side view representation of an IC 6 illustrated in FIG. 1, a routing system of the present disclosure calculates a route to each portion of a design block 8 that indicating a need for power. The design block is a sub-part of the IC for which a particular design engineer is responsible, and such design block may be dedicated to a particular function, such as, for example, a design block might perform floating point operations, instruction prefetch, instruction decode, or data input/output. Each of these design blocks comprise a plurality of logical cells 20–23 formed in the transistor substrate layer 10, and each logical cell may have power (VDD) and ground (GND) requirements, which are designed into the design block 8 as power contacts. The design engineer preferably designs not only the type and location of the logical cell 20–23, but also the signal routing that may occur therebetween, such as, for example, signal route 24 and signal route 25. In addition, the design engineer designs within the design block 8 areas that are dedicated to power contacts. Such power contacts are preferably rectangular areas within the design block located on one of the plurality of metal interconnect layers M1–M5 that preferably are contacted with a solder bump 12 for operation.

The routing system uses the parsed data that is representative of the design block 8 to automatically design power routes to power contacts designed within the design block 8. More specifically, the routing system computes a conductive path from a solder bump 12, e.g., a C-4 bump, which is connected to a plurality of power buses 13 of a first metal interconnect layer M5 to such power contact within the design block 8 through each of the metal interconnect layers M1–M4. Such conductive path may take the form of vias that are contacted down from one power bus 13 to a power bus 14 on a subsequent layer M4. Further, the conductive path may be continued by providing metal "fill" 18 in a metal layer, which connects a one via to another via.

In computing the conductive path, the routing system discerns designated subsets of the textual data representative of the design block 8, which indicate regions that are reserved for signal routing within the design block 8. The routing system then further designs power routes, which when effectuated route power from power connections to power contacts having locations within the design block 8 described in the textual data without adulterating such designated regions.

Figure 2:
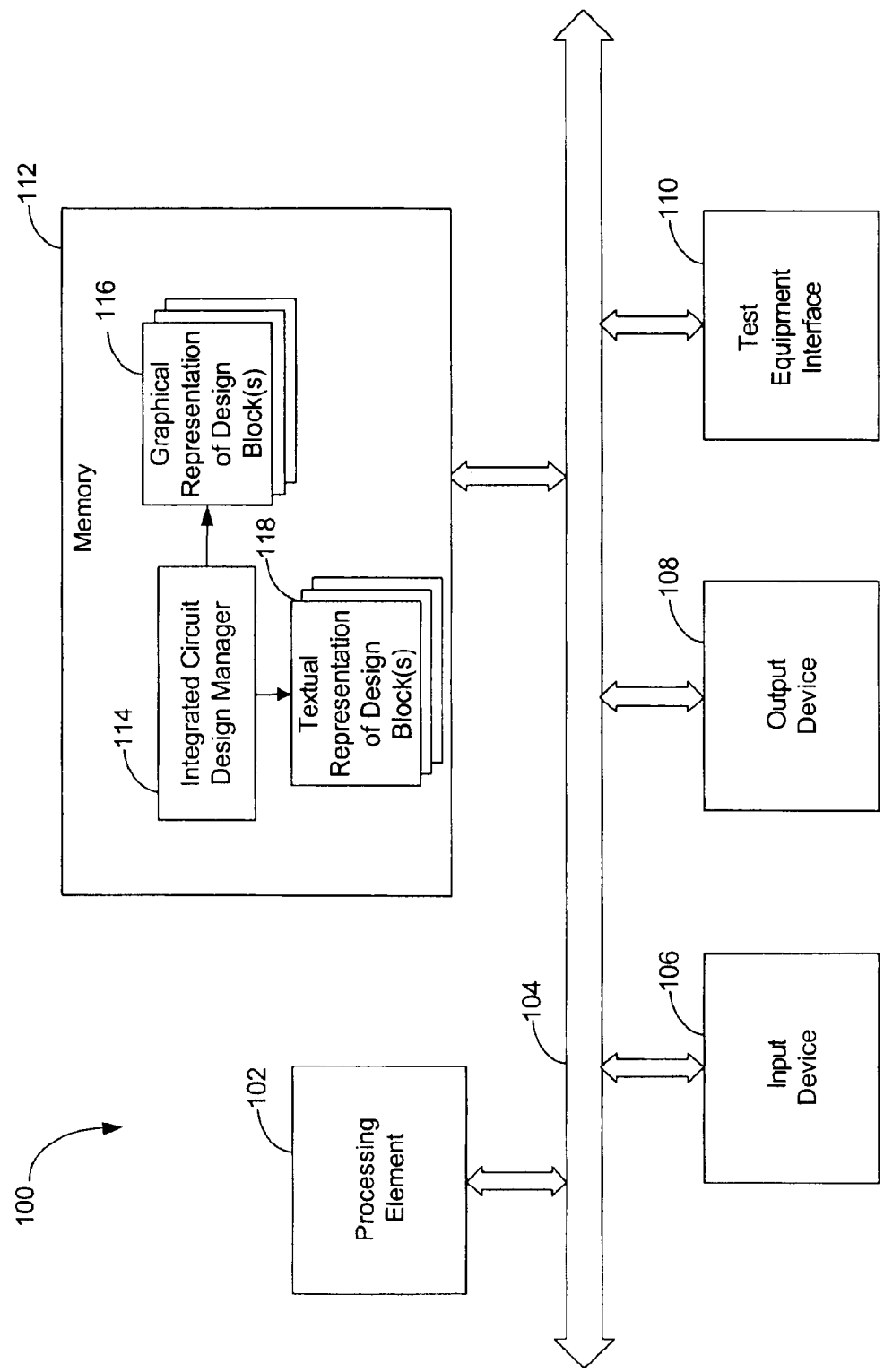
FIG. 2 is a block diagram illustrating a conventional integrated circuit (IC) design system.

A conventional automated IC design system 100 is illustrated in FIG. 2. The system 100 comprises generally a processing element 102, an input device 106, an output device 108, and memory 112. The memory 112 comprises integrated circuit (IC) design manager 114.

The IC design manager 114 of the design system 100 generally enables a user (not shown) to design an IC or an IC sub-component, hereinafter referred to as a "design block," via a graphical user interface (GUI). Such a design block comprises a transistor layer, which includes a plurality of logical cells, that are interconnected via a plurality of metal interconnect layers. The architecture of the design block and its relation to the present disclosure is described in further detail with reference to FIGS. 3–8.

A GUI enables a user to select appropriate logical cells, for example, transistors, diodes, capacitors, etc., which perform a desired function. The GUI creates a graphical representation of the design block 116 that may be used by the design manager 114 to simulate and/or test the operation of the design block using requisite input/output values provided by a user or an automated simulation process.

Note that the graphical representation of the design block 116 may be viewed by the user via the output device 108. Such a graphical representation 116 preferably enables the user to view the differing logical cells making up the design block and the interconnections therebetween. As noted herein, the logical cells implemented in an IC are formed in a transistor layer. Further, the graphical representation 116 provides the user the ability to view the interconnections in the plurality of metal interconnect layers between the plurality of logical cells. Such graphical representation may then be used to manually design signal routing from the topmost level of the IC thereby designing routing that provides power and ground to the logical cells 20–23 (FIG. 1).

The IC design manager 114 translates the graphical representation of the design block 116 into a textual representation of the design block 118. Such graphical representation 116 and textual representation 118 may then in turn be used to create a mask, which is used in manufacturing to fabricate the plurality of metal layers M1–M5 (FIG. 1) and the transistor layer 10 (FIG. 1) of the IC.

The IC design manager 114 may display a GUI, via the output device 108, which includes a representation of the design block and a template of circuit components that a user may select when creating the design block. Via the input device 106, the user can select various electronic components and arrangements of components, when creating the design block.

Figure 3:
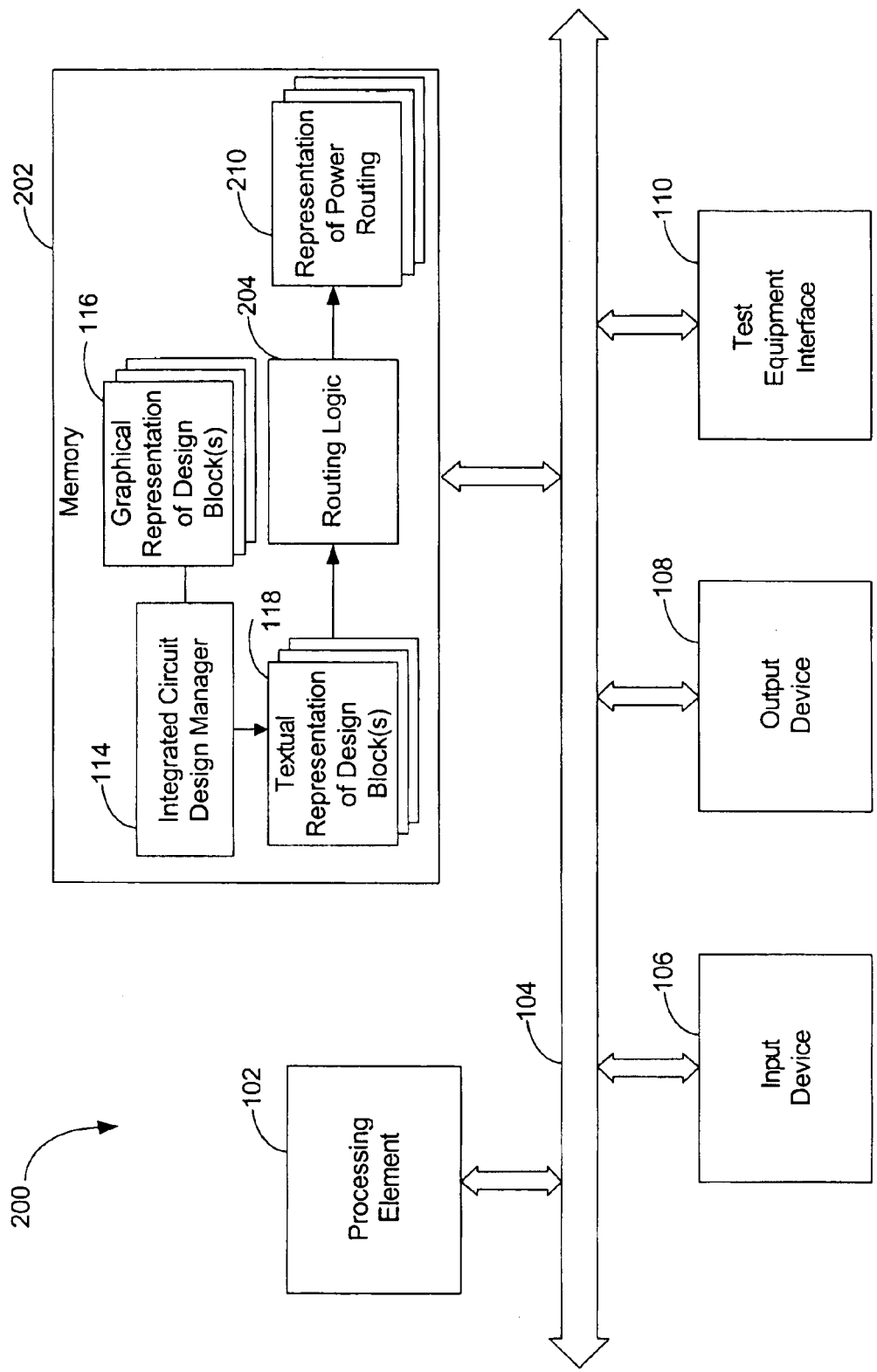
FIG. 3 is a block diagram illustrating an embodiment of a routing system of the present disclosure.

A system 200 in accordance with an exemplary embodiment of the present disclosure is illustrated in FIG. 3. The routing system 200 comprises a processing element 102, an input device 106, an output device 108, and memory 202. The memory 202 comprises integrated circuit (IC) design manager 114 and power routing logic 204.

A user (not shown) of system 200 designs at least one design block via the IC design manager 114. In so designing, the IC design manager 114 creates a graphical representation of the design block 116 and a textual representation of the design block 118. The power routing logic 204 then automatically parses the textual representation to determine the location of a power contact within the design block and a power route to such location from a power connection. Note that a power connection is a point within an integrated that is receiving power from a source.

Further, the power routing logic 204 preferably creates a textual and/or graphical representation 210 of the power routing designed by the routing logic 204. Such representation can be a discrete entity, such as is shown in FIG. 3, or such representation may be concatenated to or integrated into the textual representation 118 and/or graphical representation 116 of the design block.

In determining the location and power route to a power contact located in the design block, the routing logic 204 first determines the location of the design block in relation to the overall design of the IC. In this regard, the textual representation of the design block 118 preferably comprises data identifying a horizontal and a vertical location of the design block relative to a top view of the integrated circuit. Such data may comprise key words associated with data points that define the boundaries of various design blocks. For example, the textual representation 118 may comprises the following two entries:

| POINTA: | 5000, 12000 | A.1 |
| POINTB: | 25000, 27000 | A.2 |

With reference to entry A.1, the routing logic 204 searches the textual data for the key word POINTA, which is preferably associated with two values that are indicative of the lower left point of the design block in relation to a top view of the IC. In the example provided, the routing logic 204 retrieves a horizontal value, e.g., 5000, and a vertical value, e.g., 12000. These values indicate that a first reference point for the design block for which the routing logic 204 is routing power and ground is located at horizontal position 5000 with reference to a two-dimensional top view of the IC and at a vertical position 12000 with reference to a two-dimensional top view of the IC.

With reference to line A.2, the routing logic 204 searches the textual data for the key word POINTB, which is preferably associated with two values that are indicative of the top right point of the design block in relation to a top view of the IC. In the example provided, the routing logic 204 retrieves a horizontal value, e.g., 25000, and a vertical value, e.g., 27000. These values indicate that a first reference point for the design block for which the routing logic 204 is routing power and ground is located at horizontal position 25000 with reference to a two-dimensional top view of the IC and at a vertical position 27000 with reference to a two-dimensional top view of the IC.

Figure 4:
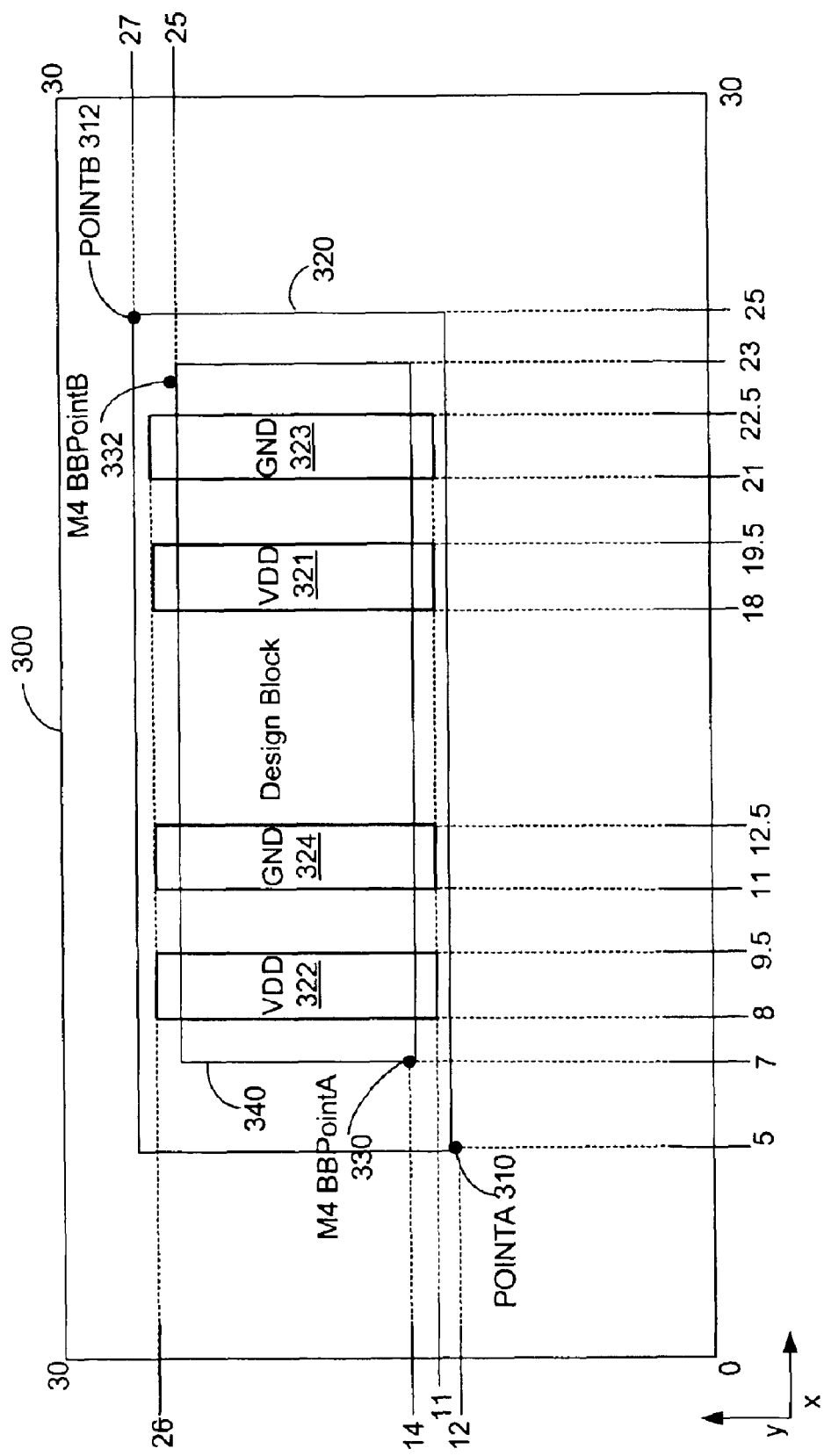
FIG. 4 is a top view of an integrated circuit illustrating an exemplary arrangement of a design block and contacts.

FIG. 4 illustrates the general location of a design block 320 with reference to the top view of an IC 300. Note that the position values may be in units of microns or nanometers, for example. Hence, the top view of the IC 300 is not representative of an actual size of an IC, but is only provided for illustrative purposes. Thus, as shown, the top view 300 indicates a reference point at horizontal position zero (0) and vertical position zero (0) and the top view comprises a reference x-y axis as indicated. The IC comprises a horizontal axis parallel to the x-direction from horizontal position zero (0) to horizontal position thirty (30) and a vertical axis parallel to the y-direction from vertical position zero (0) to vertical position thirty (30). The horizontal position and the vertical position of a point with respect to the reference point will hereinafter be referred to as the x-value and the y-value, respectively. Thus, POINTA has an x-value of 5000 and a y-value of 12000, and POINTB has a x-value of 25000 a y-value of 27000. POINTA and POINTB define the perimeter of the design block 320.

In addition to containing the location points of the design block, the textual representation 118 further preferably comprises data indicative of the location of power contacts that have been designed into the design block. Such data may comprise key words associated with data points that define the boundary of power and/or ground contacts. For example, the following entries may be included in the textual representation 118:

| VDD: | M3, 8000, 13000, 9500, 26000 | B.1 |
| --- | --- | --- |
| GND: | M3, 11000, 13000, 12500, 26000 | B.2 |
| VDD: | M3, 18000, 13000, 19500, 26000 | B.3 |
| GND: | M3, 21000, 13000, 22500, 26000 | B.4 |

With reference to entry B.1, the routing logic 204 searches the textual data for the key word VDD, which is preferably associated with five values that identify a metal interconnect layer and a position of a rectangular area on such metal interconnect layer that needs power. Note that VDD indicates a positive power contact for the location defined. In the example provided, the routing logic 204 retrieves a metal interconnect value, e.g., M3, which signifies that a power contact VDD 322 is located on metal interconnect layer three (3). In addition, the routing logic 204 retrieves location values, e.g., 8000, 13000, 9500, 26000, which preferably indicate that the power contact VDD 322 is defined by a lower left point having an x-value of 8000 and y-value 13000 and an upper right point having an x-value of 9000 and a y-value of 26000.

Likewise, with reference to entry B.3, the routing logic 204 locates a second power contact VDD 321 and for this second VDD 321 retrieves a metal interconnect value, e.g., M3, which signifies that the additional power contact VDD 321 is located on interconnect layer M3. In addition, the routing logic 204 retrieves location values, e.g., 18000, 13000, 19500, 26000, which preferably indicate that the additional power contact VDD 321 is defined by a lower left point having an x-value of 18000 y-value 13000 and an upper right point having an x-value of 19000 and a y-value of 26000.

With reference to entry B.2, the routing logic 204 searches the textual data for the key word GND, which also preferably comprises three values that are indicative of a metal interconnect layer and the position on such metal interconnect layer that needs ground. Note that GND indicates a negative power contact for the location defined. In the example provided, the routing logic 204 retrieves a metal interconnect value M3. In addition, the routing logic 204 retrieves location values, e.g., 11000, 13000, 12500, 26000, which preferably indicate that the location of a power contact GND 324 is defined by a lower left point having an x-value of 11000 and y-value 13000 and an upper right point having an x-value of 12500 and a y-value of 26000.

Likewise, with reference to entry B.4, the routing logic 204 locates a second power contact GND 232 and retrieves a second metal interconnect value M3, which signifies that the second power contact GND 323 is located on metal interconnect layer three M3. In addition, the routing logic 204 retrieves location values, e.g., 21000, 13000, 22500, 26000, which preferably indicate that the location of a power contact GND 323 is defined by a lower left point having an x-value of 21000 and y-value 13000 and an upper right point having an x-value of 22500 and a y-value of 26000.

FIG. 4 further illustrates the general locations of the aforementioned power contacts VDD 321 and 322 on M3 and ground contacts GND 323 and 324 on according to a top view of IC 300. Note, however, that the top view does not accurately depict the location of such values three-dimensionally. Thus, as described herein, such contact points may be located on any of a plurality of metal interconnect layers, e.g., M1–M8. As illustrated in FIG. 4, GND 324 and 323 and VDD 322 and 321 are located with reference to the top view of the IC 300 within the design block 320.

In addition, the textual file 118 may comprise data indicative of a boundary box, which is a region that is not to be used by the routing logic 204 when routing power and ground to such power contacts VDD 321 and 322 and ground contacts GND 324 and 323. Such data may comprise key words associated with data points that define the boundary box of regions. As an example, the textual representation may comprise the following entries:

| BBPOINTA | M4, 7000, 14000 | C.1 |
| --- | --- | --- |
| BBPOINTB | M4, 23000, 25000 | C.2 |

With reference to entry C.1, the routing logic 204 searches the textual data for the key word BBPOINTA, which comprises three values that are indicative of the metal interconnect layer of the boundary box and the lower left point of the boundary box region in relation to a top view of the IC 300. In the example provided, the routing logic 204 retrieves M4, which indicates that the boundary box is located on metal interconnect layer four (4). Further, the routing logic 204 retrieves an x-value, e.g., 7000, and a y-value, e.g., 14000, which indicate the lower left reference point for the region defined by the boundary box that the routing logic 204 is unable to use when routing power and ground.

With reference to entry C.2, the routing logic 204 searches the textual data for the key word BBPOINTB, which comprises three values that are indicative of the metal interconnect layer of the boundary box and the upper right point of the boundary box region in relation to a top view of the IC 300. In the example provided, the routing logic 204 retrieves M4, which indicates metal interconnect layer four (4). Further, the routing logic 204 retrieves an x-value, e.g., 23000, and a vertical value, e.g., 25000, which indicate a second reference point along the perimeter of the boundary box that the routing logic 204 is unable to use when routing power and ground.

With reference to FIG. 4, the boundary box 340 is illustrated with reference to the top view of the IC 300 and the design block 320 and the power contacts VDD 322 and 321 and GND 324 and 323.

In summary, the textual representation 118 defines a design block 320. Further, textual representation 318 defines particular power contacts, e.g., VDD 321 and 322 and particular ground contacts, e.g., GND 323 and 324, and each contact's location on a particular metal interconnect layer. Further, the textual representation 118 may define a boundary box region 340 that the routing logic 204 is unable to use when routing power and ground. Such region 340 is defined by the lower left BBPOINTA 330 and the upper right BBPOINTB 332, which are both indicated as being located on metal interconnect layer M3.

An exemplary design of the power routing performed by routing logic 204 is now described in more detail with reference to FIGS. 5–8.

Figure 5:
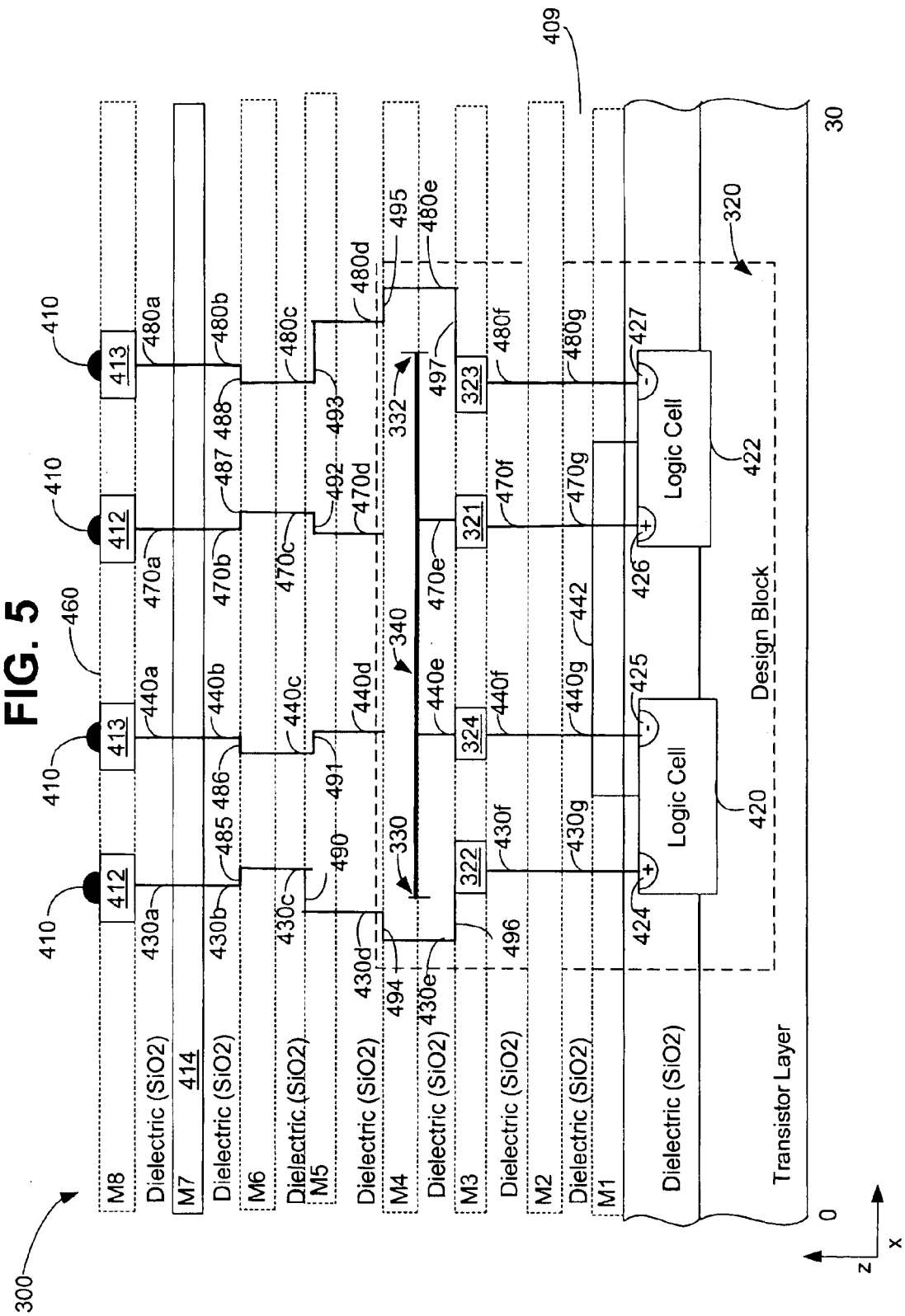
FIG. 5 is a side view of the integrated circuit of FIG. 4 comprising eight metal interconnect layers (M1–M8).

FIG. 5 illustrates a two-dimensional side view representation of a portion of the IC 300 of FIG. 4. As shown, IC 300 comprises eight metal interconnect layers M1–M8. Each metal interconnect layer M1–M8 is separated from each of the other interconnect layers and the transistor layer by at least one layer 409 of dielectric material. Further, IC 300 comprises logical cells 420 and 422, which, as described herein, may comprise transistors, diodes, capacitors or any other type of electronic component known or hereafter developed.

The IC 300 is preferably configured to receive power and ground via solder bumps, e.g., C-4 bumps 410, that are in contact with the VDD buses 412 and the GND buses 413 of M8. Such solder bumps 410 are preferably connected to an external power and ground source (not shown). As identified, with reference to FIG. 4, the example textual data describes power contacts VDD 321 and 322, within the design block 320. Further, the textual data describes ground contacts GND 323 and 324 within design block 320.

Note that the design block 320 in FIG. 5 comprises two logical cells 420 and 422. Logical cell 420 is shown having a positive power contact 424 and a negative power contact 425, which are routed within the design block to VDD contact 322 and GND contact 324 using vias 430a–430e and 440a–440e, respectively. Logical cell 422 is shown having a positive power contact 426 and a negative power contact 427, which are routed within the design block to VDD contact 321 and GND contact 323 using vias 470a–470e and 480a–480e, respectively. In other embodiments, other numbers of logic cells may also be implemented on the transistor layer and routed through vias from the VDD buses 412 and GND buses 413 to power and ground contacts on any of the metal layers.

Initially, the routing logic 204 contacts down, from a layer to the next the power and ground buses 412 and 413. For example, with reference to IC 300 of FIG. 4, the routing logic 204 may ascertain the location of power contact 322. Therefore, the routing logic 204 begins by contacting down from power bus 412 through via 430a to power bus 415 (not shown in FIG. 5), which is shown in a top view of the IC 300 in FIG. 5 and FIG. 6. Thus, each VDD bus 412 is connected to a corresponding power bus 415 (FIG. 5 and FIG. 6) and each GND bus 413 is connected to a corresponding ground bus 414 of layer M7 through vias 430a, 440a, 470a, and 480a. Note that the routing logic 204 routes the power and ground in this predictable manner until it reaches a metal interconnect layer, which is included in the design block 320, to which the routing logic 204 is routing power and ground.

If there exists a region on an interconnect layer between M8 and the power contacts 321–324, then the routing logic 204 routes power to the contacts 321–324 by circumventing the region. Specifically, the routing logic 204 routes power in the manner described to the metal interconnect layer M1–M8 preceding the first layer contained with the design block 320. If there is a boundary box region in the next layer, then the routing logic 204 provides a metal fill in a direction and for a particular length that when contact is made between the current layer and the next layer, the boundary box region will be avoided.

The routing logic 204 contacts down to layer M6 through vias 430b, 440b, 470b, and 480b. On layer M6, the routing logic 204 establishes metal fills 485–488 and contacts these metal fills down to layer M5 through vias 430c, 440c, 470c, and 480c.

At this preceding metal interconnect layer M1–M5, the routing logic 204 then shifts the routing of each conductive path, 430a–430f, 440a–440f, 470a–470f and 480 a–480f to avoid the boundary box region 340 designated in the textual representation. In this regard, the routing logic 204 establishes, for example, a metal fill 490 or a metal fill 493 that is oriented in a horizontal direction, which enables power and ground to be connected to metal interconnect layer M4 without using that region of M4 designated as a boundary box by the textual representation 118. Such metal fills 490 and 493 are then contacted down to the useable portion of M4, and the routing logic 204 proceeds to establish metal fills 494 and 495 in the useable area of M4 that are then contacted down to M3. The routing logic 204 then establishes, for example, metal fills 496 and 497 that are oriented in a horizontal direction, which enables power and ground to be connected to VDD 322 and GND 323. A similar method may be employed when establishing connections from GND bus 413 to GND 324 and VDD 412 to VDD 321.

Note that the routing logic 204 routes power for power contact 322 through vias 430a–430e. Such route through vias 430a–430e is shifted on M5 through a connection 490, e.g., a fill in M5 that shifts the vertical route of the connection in order to avoid the boundary box 340 directly below the via 430c. Additional vias 430d and 430e establish connection to M3. The routing logic 204 then designs a connection 496 establishing a complete route from solder bump 410 (FIG. 5) to the power contact VDD 322. Such routing method is applied to GND 324, VDD 321 and GND 323. However, the specifics to routing these additional contacts are not described in detail for brevity.

Figure 6:
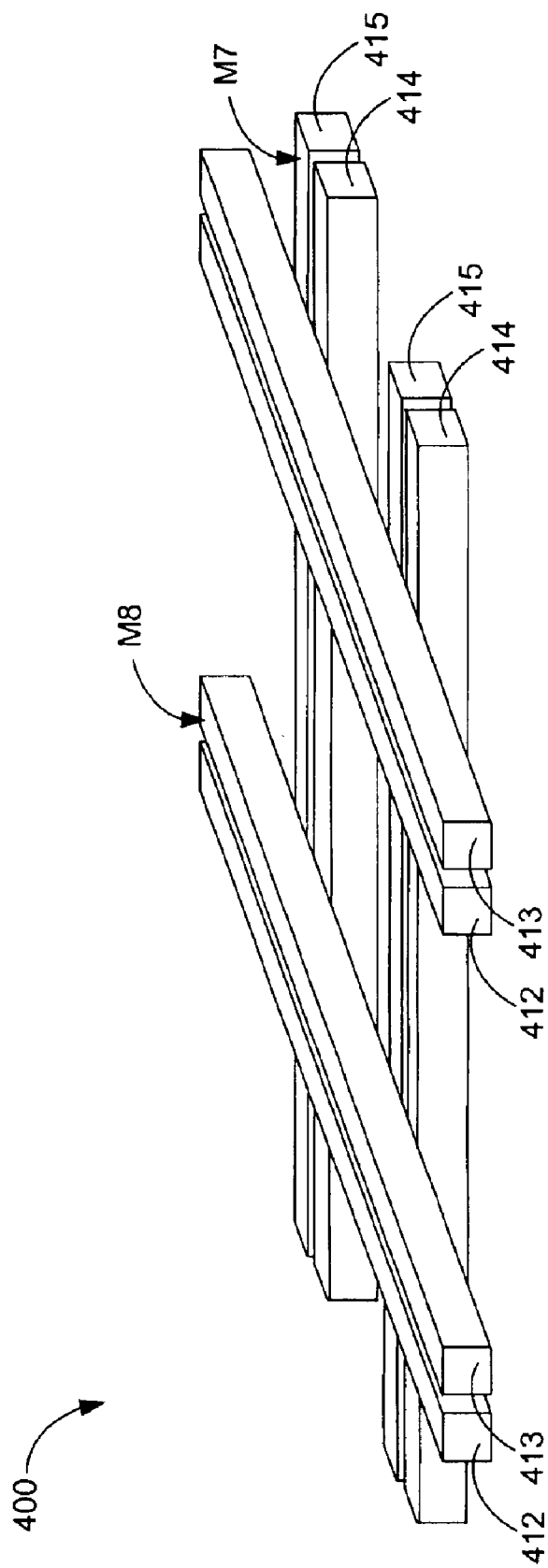
FIG. 6 is a three-dimensional representation of M7 and M8 of FIG. 5.

FIG. 6 illustrates three-dimensionally an exemplary arrangement of power and ground buses for layers M8 and M7 of FIG. 5. Metal interconnect layer M8 preferably comprises a plurality of alternating VDD/GND bus pairs 412 and 413, respectively. As illustrated in FIG. 5, the metal interconnect layer M8 comprises power and ground buses 412 and 413 oriented in a vertical direction (i.e., the y-direction), whereas the metal interconnect layer M7 comprises power and ground buses 414 and 415 oriented in a horizontal direction (i.e., the x-direction).

An external power source is contacted with the VDD bus 412 and the GND bus 413 with a solder bump 410 (FIG. 5). The routing logic 204 then contacts the power and ground buses 412 and 413 down to the subsequent layer M7 based upon a VDD or GND need ascertained from the textual representation 118 (FIG. 3).

Figure 7:
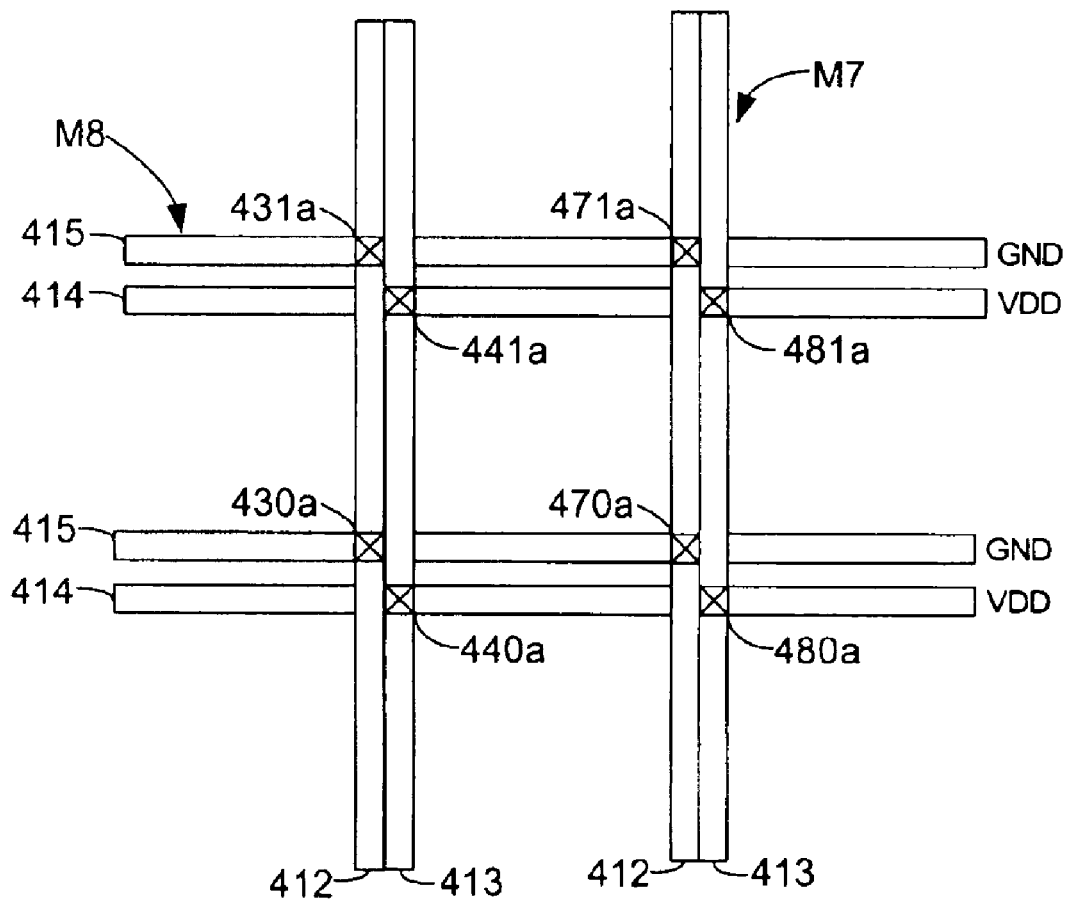
FIG. 7 is a top view of the IC of FIG. 4 illustrating an exemplary power grid arrangement of M7 and M8.

In this regard, FIG. 7 further illustrates a plurality of via locations that may be established by routing logic 204 in order to connect an external power source to a VDD or GND need ascertained. As illustrated, layer M8 comprises VDD bus 412, which is connected to VDD bus 415 of M7 by contacting down through vias 430a, 431a, 470a, and 471a. Further, GND buses 413 are connected to GND buses 414 of layer M7 through vias 440a, 441a, 480a, and 481a.

Figure 8:
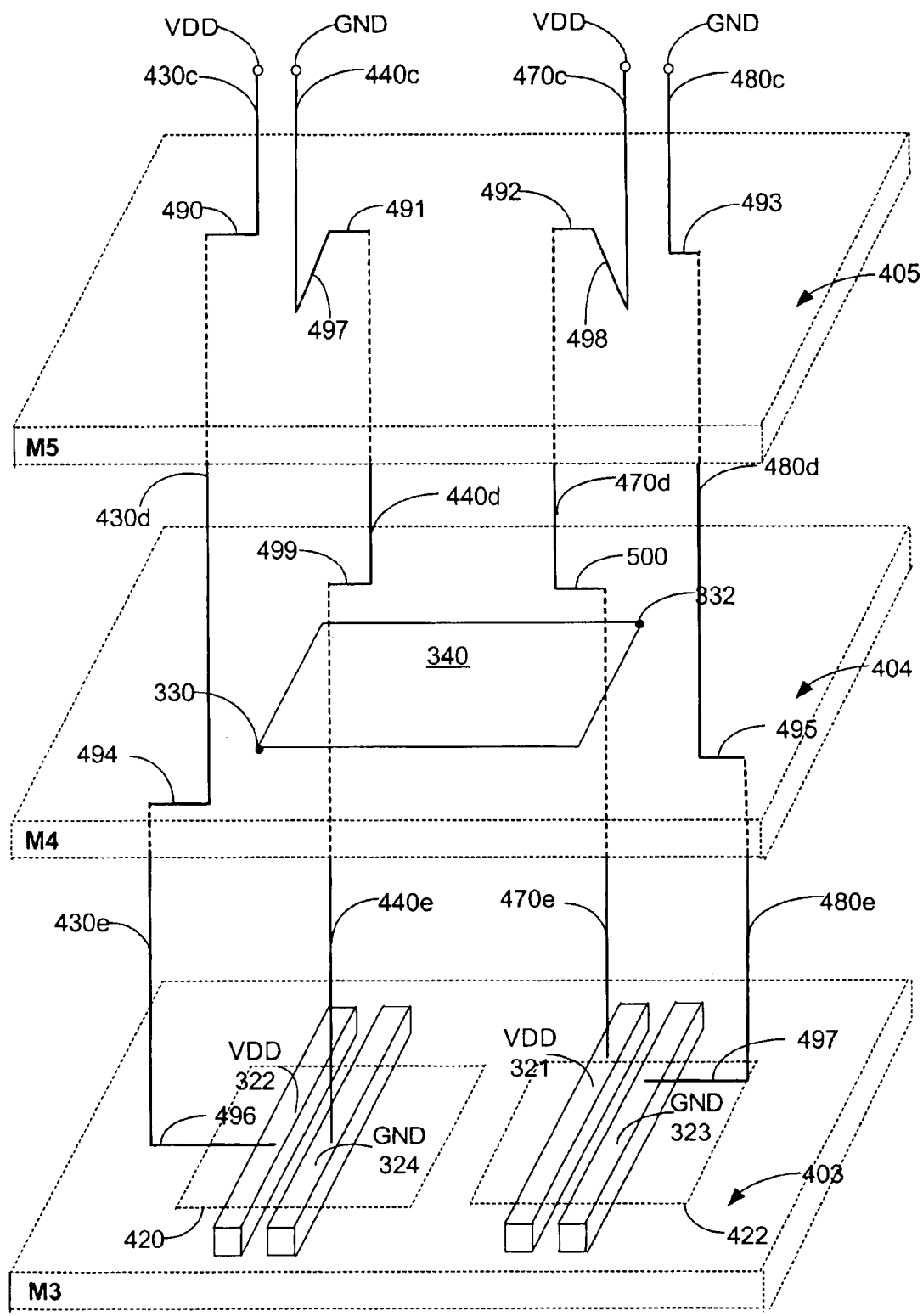
FIG. 8 is a three-dimensional representation of an exemplary design of M3–M5 of FIG. 5.

The routing logic 204 is further described with reference to FIG. 8. FIG. 8 illustrates a three-dimensional routing of VDD and GND through metal interconnect layers M5, M4, and M3. As described with reference to FIG. 5, the routing logic 204 routes power to VDD 322 through vias 430c–430e, to GND 324 through vias 440c–440e, to VDD 321 through 470c–470e, and to GND 323.

The routing logic 204 establishes horizontal metal fill 490–493 and vertical fill 497 and 498 on M5 in order to divert the power and ground routes away from boundary box 340 of M4. The routing logic 204 then contacts down to M4 the fills 490–493 through vias 430d, 440d, 470d, and 480d. On M4, the routing logic 204 then designs the location and lengths of fills 494, 495, 499 and 500, which it then contacts down to M3 through vias 430e, 440e, 470e, and 480e. M3 is the metal layer that comprises the contacts VDD 322, GND 324, VDD 321, and GND 323. Therefore, the routing logic 204 then establishes fill 496 and 497 to connect VDD 322 and GND 323. GND 324 and VDD 321 are connected when the routing logic 204 routes the fills down from M4.

Thus, by use of the textual representation 118 of the design box 320, the routing logic 204 automatically designs power and ground routing to the design box 320. The routing logic 204 employs a set of data that indicates locations of certain connections for an IC design.

Figure 9:
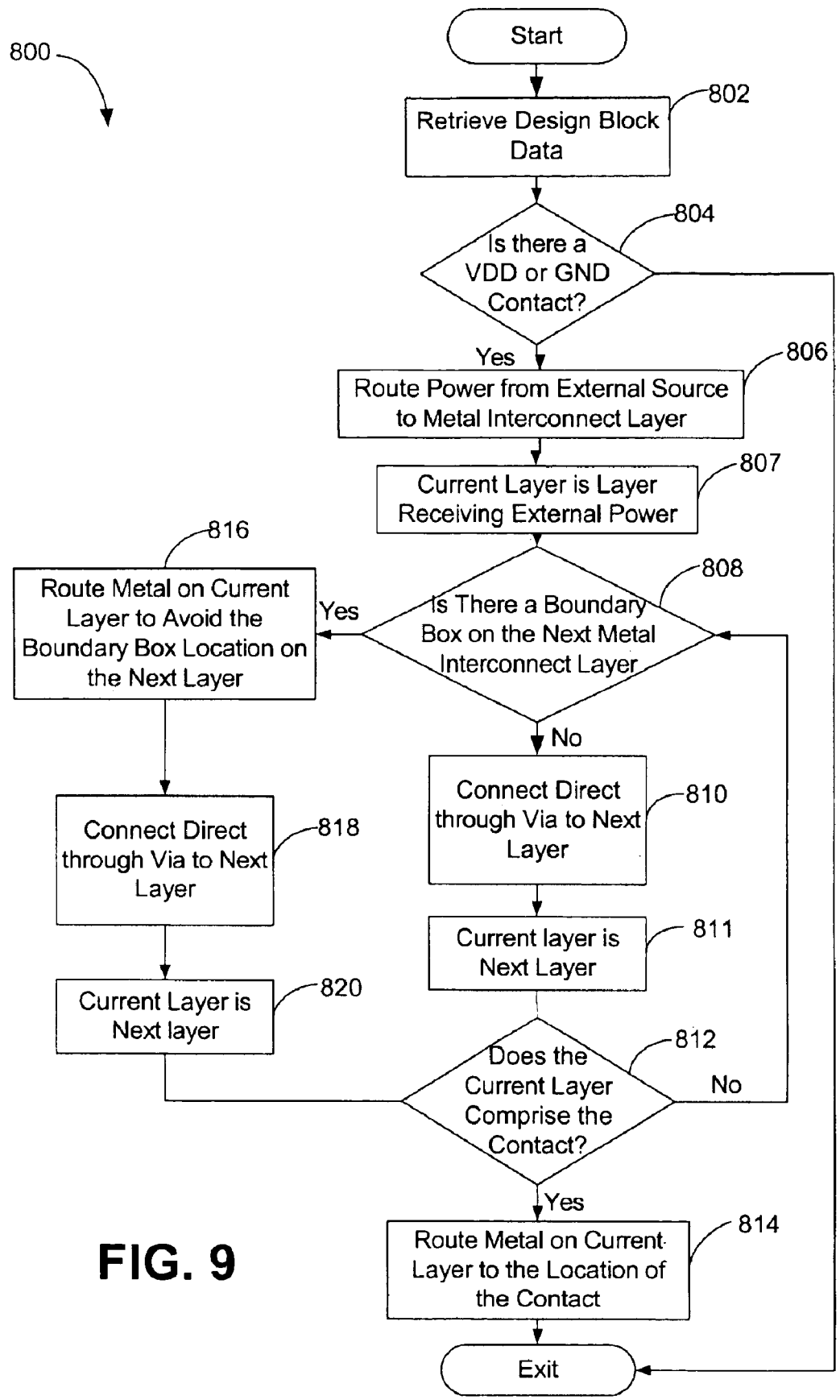
FIG. 9 is a flowchart illustrating a detailed exemplary architecture and functionality of the routing logic of FIG. 3.

An exemplary architecture and functionality of the routing logic 204 is illustrated with reference to the flowchart 800 of FIG. 9.

The routing logic 204 retrieves the design block data, as indicated in step 802. Such design block data is preferably contained with a dataset, which may be stored, for example, in a database or in a text file. Such design block data preferably contains values indicative of the location of the design block with reference to a two-dimensional representation of the IC 300 (FIG. 4). Further, design block data preferably further includes values indicative of VDD contact locations and GND contact locations, including the layer at which such contacts are to be made. The design block data also preferably includes values indicative of boundary blocks, which define regions that are off-limits to the routing logic 204, or, in other words, may not be used by the routing logic 204 when determining locations of vias and metal fills. Other data that may be used in routing the connections may comprise values indicative of the widths of the metal that is to be used when establishing connections on metal layers, the separation between two metals being placed on the metal layers, where the next metals will be placed, etc.

If there is not a VDD or GND contact in the design block, as indicated in step 804, then the routing logic 204 exits. As described herein, an exemplary embodiment of the routing logic 204 performs a search on a textual representation 118 (FIG. 3) of the design block 320 (FIGS. 4 and 5) for which power and ground routing is being performed. If the routing logic 204 locates "VDD" or "GND" within the textual representation 118, then it begins the process of establishing a connection from an external source to the power or ground contact.

The routing logic 204 first establishes a connection from an external power source via a solder bump 410 (FIG. 5) to the top interconnect layer M8, as indicated in step 806. As indicated herein with reference to FIG. 6, layer M8 preferably comprises a set of alternating VDD/GND buses, e.g., VDD 463/GND 462, VDD 461/GND 460. The routing logic 204 designs a via to route from one of the VDD or GND buses, depending upon whether the contact being routed is VDD or GND, to a bus on M7.

The routing logic 204 then determines if there is a boundary box on the next metal interconnect layer M1–M6 (FIG. 5), as indicated in step 808. As described herein, an exemplary routing logic 204 determines the existence and location of a boundary box on the next layer by searching the textual representation 118 of the design block 320.

If there is a boundary box on the next metal interconnect layer M1–M6, then the routing logic 204 routes metal on the current layer to a location that avoids the boundary box location on the next layer, as indicated in step 816. The routing logic 204 then connects direct through a via to the next layer, as indicated in step 818. The current layer is now the next layer, as indicated in step 820.

If the current layer comprises the contact for which the routing logic 204 is routing power or ground, as indicated in step 812, then the routing logic 204 routes metal on the current layer to the location of the contact, as indicated in step 814. However, if the current layer does not comprise the contact, as indicated in step 812, then the routing logic 204 determines if there is a boundary box in the next metal interconnect layer M1–M6, as indicated in step 808.

If there is not a boundary box on the next metal interconnect layer, as indicated in step 808, then the routing logic 204 routes the connection direct through a via to the next layer, as indicated in step 810. The current layer then becomes the next layer, as indicated in step 811, and the routing logic 204 determines if the current layer comprises a contact, as indicated in step 812. This process continues until each power contact defined in a set of data representative of an IC has power route connected to it.

Note that other embodiments may be implemented that design routing for multiple design blocks, even though process 800 only shows retrieving data for a single design block. Further, other embodiments may also route power for multiple contacts, for example the design block in FIG. 5.

Figure 10:
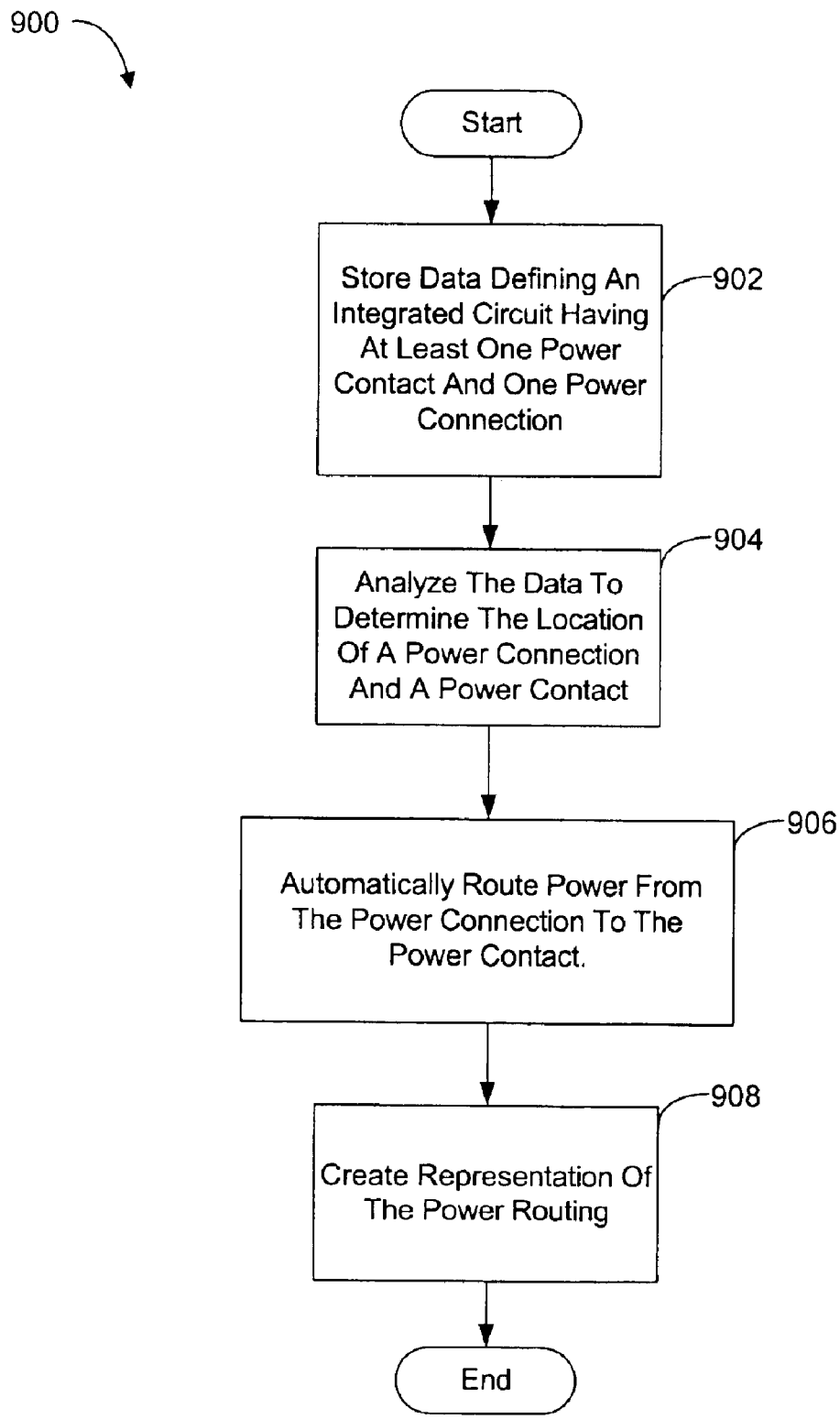
FIG. 10 is a flowchart illustrating a general exemplary architecture and functionality of the routing logic of FIG. 3.

FIG. 10 illustrates a general architecture and functionality of the routing logic 204 of FIG. 3. The routing logic 203 stores data defining an integrated circuit having at least one power contact and one power connection, as indicated in step 902. Such data representation can take the form of a textual representation 118 (FIG. 3) or a graphical representation 116 (FIG. 3). Further such textual representation 118 or graphical representation 116 may be created by integrated circuit manager 114 (FIG. 3).

The routing logic 204 analyzes the data to determine the location of the power connection 410 (FIG. 5) and the power contact 321–324 (FIG. 5), as indicated in step 904. The location of the power connection and the power contact may be expressed textually, for example, in the textual representation 118 using an x-y coordinate system and providing an x-value and a y-value per location points of the power connection and the power contact.

The routing logic 204 then automatically routes power from the power connection to the power contact 321–324 (FIG. 5), as indicated in step 906. The routing logic 204 provides a connection from the power connection 410 to the power contact 321–324 through multiple interconnect layers M1–M8 from an external power source, and such routing avoids any boundary boxes that may exist on such metal interconnect layers M1–M7.

The routing logic 204 then creates a representation of the power routing 210 (FIG. 3), as indicated in step 908. This representation may include a textual representation, a graphical representation, or both.

Figure 11:
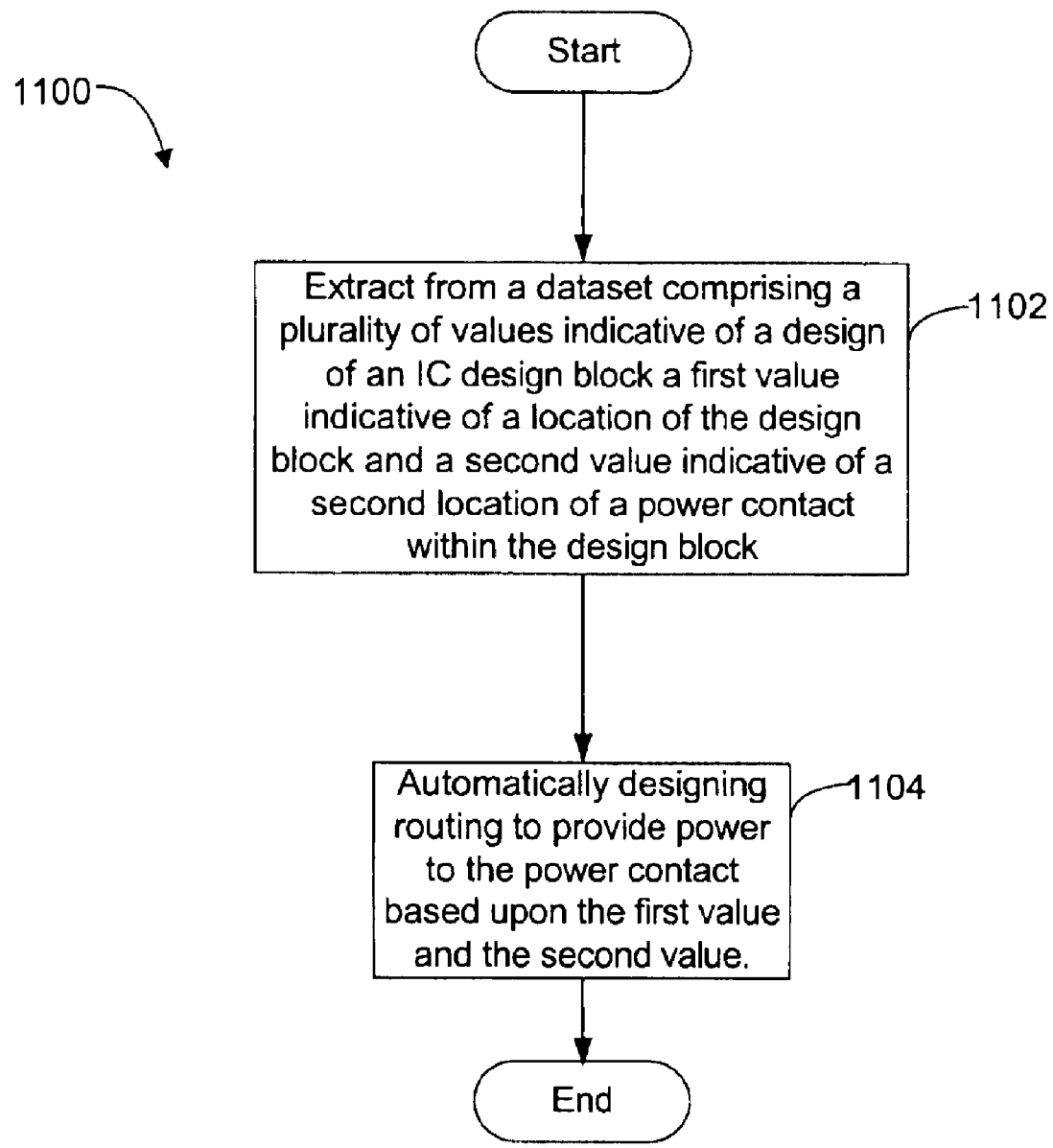
FIG. 11 is a flowchart illustrating another exemplary architecture and functionality of the routing logic of FIG. 3.

FIG. 11 illustrates another embodiment of the routing logic 204 of the present disclosure. The flowchart 1100 first indicates the step of extracting from a dataset comprising a plurality of values indicative of a design of an IC design block 320 (FIG. 4) at least a first value indicative of a location POINTA 312 or POINTB 310 of the design block 320 and a second value indicative of a second location of at least one power contact 321–324 (FIG. 4) within the design block 320. The routing logic 204 then automatically designs routing to provide power to the power contact 321–324 based upon the first value and the second value, as indicated in step 1104.

What is claimed is:

1. A system for automatically routing power in an integrated circuit, the system comprising:
   memory for storing data defining a representation of an integrated circuit having a power contact and a power connection; and
   logic configured to analyze the data and determine a first location of the power contact and a second location of the power connection based on the data, the logic further configured to automatically route power from the power connection to the power contact.

2. The system of claim 1, wherein the data defines a design block of the integrated circuit, the design block comprising the power contact.

3. A system for automatically routing power in an integrated circuit, the system comprising:
   memory for storing data defining a representation of an integrated circuit having a power contact and a vower connection; and
   logic configured to analyze the data and to automatically route power from the power connection to the power contact, wherein the data defines a design block of the integrated circuit, the design block comprising the power contact, and wherein the data further comprises boundary box data defining a region that comprises a plurality of signal routes.

4. The system as claimed in claim 3, wherein the logic is further configured to automatically route power from the power connection to the power contact thereby circumventing the region defined by the boundary box data.

5. A system for automatically routing power in an integrated circuit, the system comprising:
   a dataset indicative of the characteristics of a design block corresponding to an integrated circuit (IC); and
   logic configured to extract from the dataset a first value indicative of a first location of the design block and a second value indicative of a second location of one power contact, the logic further configured to automatically design routing of power to the one power contact based upon the first value and the second value.

6. The system of claim 5, wherein the dataset comprises a subset of data indicative of a metal interconnect layer, the subset of data comprising a third value indicative of a boundary box defining a region that is reserved for signal routing within the design block.

7. The system of claim 6, wherein the logic is further configured to design a route circumventing the boundary box defining the region that is reserved for signal routing within the design block.

8. A system for automatically routing power in an integrated circuit, the system comprising:
   means for storing data defining a representation of an integrated circuit having a power contact and a power connection;
   means for analyzing the data;
   means for defining a design block of the integrated circuit, the design block comprising the power contact;
   means for defining boundary box data defining a reaction that comprises a plurality of signal routes; and
   means for automatically routing power from the power connection to the power contact based upon the design block and boundary box defined.

9. A computer program for automatically routing power in an integrated circuit, the computer program being embodied on a computer-readable medium, the program comprising:
   logic for storing data defining a representation of an integrated circuit having a power contact and a power connection;
   logic for analyzing the data to determine a location of the power connection and the power contact;
   logic for automatically routing power from the power connection to the power contact; and
   logic for creating a representation of the power routing.

10. A method for automatically routing power in an integrated circuit, the method comprising the steps of:
    extracting from a dataset comprising a plurality of values indicative of a design of an IC design block a first value indicative of a first location of the design block and a second value indicative of a second location of a power contact within the design block; and
    automatically designing routing to provide power to the power contact based upon the first value and the second value.

11. The method of claim 10, wherein the dataset comprises a subset of data indicative of a metal interconnect layer, the subset of data comprising a third value indicative of a boundary box defining a region that is reserved for signal routing within the design block.

12. The method of claim 11, further comprising the step of designing power routing circumventing the boundary box defining the region that is reserved for signal routing within the design block.

13. A method for automatically routing power in an integrated circuit, the method comprising the steps of:
    storing data defining a representation of an integrated circuit having a power contact and one power connection;
    analyzing the data to determine the location of the power connection and the power contact;
    automatically routing power from the power connection to the power contact; and
    creating a representation of the power routing.

14. The method of claim 13, wherein the data defines a design block of the integrated circuit, the design block comprising the power contact.

15. The method of claim 14, wherein the data further comprises boundary box data defining a region that comprises a plurality of signal routes.

16. The method of claim 15, further comprising the step of automatically routing power from the power connection to the power contact and circumventing the region defined by the boundary box data.

17. The method of claim 14, wherein the analyzing step further comprises the steps of:
   extracting a first set of values from the data indicative of a first location of the design block in the integrated circuit;
   extracting a second set of values from the data indicative of a second location corresponding to the power contact; and
   extracting a third set of values from the data indicative of a third location corresponding to a boundary box.

18. The method of claim 17, wherein the integrated circuit comprises a plurality of metal interconnect layers and a transistor layer and the design block encompasses a portion of the transistor layer and one of the plurality of metal interconnect layers located adjacent to the transistor layer.

19. The method of claim 18, further comprising
   designing a power route connecting the plurality of metal interconnect layers based upon the location of the design block; and
   designing the power route to connect the plurality of metal interconnect layers to the power contact of the design block based upon the location of the power contact and the location of the boundary box.

20. The system of claim 1, wherein the logic is further configured to select the first location for the power contact based on a least one signal route defined by the data.

* * * * *

UNITED STATES PATENT AND TRADEMARK OFFICE
CERTIFICATE OF CORRECTION

PATENT NO. : 6,969,952 B2
APPLICATION NO. : 10/633000
DATED : November 29, 2005
INVENTOR(S) : Eilas Gedamu et al.

Page 1 of 1

It is certified that error appears in the above-identified patent and that said Letters Patent is hereby corrected as shown below:

In column 6, line 2, after "18000" insert -- and --.

In column 11, line 45, in Claim 3, delete "vower" and insert -- power --, therefor.

In column 12, line 19, in Claim 8, delete "reaction" and insert -- region --, therefor.

Signed and Sealed this

Fourth Day of August, 2009

JOHN DOLL
*Acting Director of the United States Patent and Trademark Office*